US009958505B2

(12) United States Patent
Honda

(10) Patent No.: US 9,958,505 B2
(45) Date of Patent: May 1, 2018

(54) VOLTAGE SENSING CIRCUIT AND BATTERY PACK MONITORING SYSTEM

(71) Applicant: DENSO CORPORATION, Kariya, Aichi-pref. (JP)

(72) Inventor: Kazutaka Honda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 15/432,998

(22) Filed: Feb. 15, 2017

(65) Prior Publication Data

US 2017/0254854 A1    Sep. 7, 2017

(30) Foreign Application Priority Data

Mar. 1, 2016    (JP) .................................. 2016-38955

(51) Int. Cl.
*G01R 31/36*    (2006.01)
*H02J 7/00*    (2006.01)
*G01R 19/00*    (2006.01)
*G01R 27/08*    (2006.01)

(52) U.S. Cl.
CPC ....... *G01R 31/362* (2013.01); *G01R 31/3644* (2013.01); *H02J 7/0021* (2013.01); *H02J 7/0068* (2013.01); *G01R 19/0084* (2013.01); *G01R 27/08* (2013.01); *G01R 31/36* (2013.01)

(58) Field of Classification Search
CPC .... G01R 31/00; G01R 31/36; G01R 31/3606; G01R 31/362; G01R 31/3644; G01R 31/3658; G01R 19/00; G01R 19/0084; G01R 19/0092; G01R 27/08; H02J 7/0021; H02J 7/0068

USPC ........ 324/425, 426, 522, 713; 320/162, 161; 702/1, 57, 63, 64
See application file for complete search history.

(56) References Cited

U.S. PATENT DOCUMENTS

| | | | | |
|---|---|---|---|---|
| 5,311,085 A | * | 5/1994 | Pelgrom | H03K 5/249 327/199 |
| 7,656,226 B2 | * | 2/2010 | Johnson | H03H 19/004 330/9 |
| 8,120,209 B2 | * | 2/2012 | Tanaka | G01R 31/3658 307/112 |
| 8,143,845 B2 | * | 3/2012 | Choi | H02J 7/08 320/108 |
| 8,203,323 B2 | * | 6/2012 | Wicht | H02M 3/156 323/285 |
| 2011/0031812 A1 | * | 2/2011 | Morimoto | G01R 19/10 307/77 |
| 2012/0274360 A1 | | 11/2012 | Kultgen et al. | |

(Continued)

*Primary Examiner* — Hoai-An D Nguyen
(74) *Attorney, Agent, or Firm* — Posz Law Group, PLC

(57) ABSTRACT

A voltage sensing circuit includes a difference voltage sensing circuit and a leakage cancelling circuit. The difference voltage sensing circuit includes two sensing capacitors, a first sensing switch, a second sensing switch, and a third sensing switch. A first group including the first sensing switch and the second sensing switch and a second group including the third sensing switch are complementally turned on and turned off. The leakage cancelling circuit includes two compensation capacitors, a first compensation switch, a second compensation switch, and a third compensation switch. A third group including the first compensation switch and the second compensation switch and a fourth group including the third compensation switch are complementally turned on and turned off.

12 Claims, 10 Drawing Sheets

(56) References Cited

U.S. PATENT DOCUMENTS

2015/0008930 A1* 1/2015 Miyamoto ............ G01R 31/362
                                                      324/426
2015/0130483 A1* 5/2015 Yao ..................... H03F 3/45475
                                                      324/705

* cited by examiner

FIG. 7

| Csh:Clc | $\Delta Vd$ |
|---|---|
| 1:1 | $2.0 \cdot \Delta Vi$ |
| 1:2 | $1.5 \cdot \Delta Vi$ |
| 1:4 | $1.25 \cdot \Delta Vi$ |

FIG. 9

| Csh:Clc | $\Delta Vd$ |
|---|---|
| 1:1 | $1.5 \cdot \Delta Vi$ |
| 1:2 | $1.0 \cdot \Delta Vi$ |
| 1:4 | $0.75 \cdot \Delta Vi$ |

VOLTAGE SENSING CIRCUIT AND BATTERY PACK MONITORING SYSTEM

CROSS REFERENCE TO RELATED APPLICATION

This application is based on Japanese Patent Application No. 2016-38955 filed on Mar. 1, 2016, the disclosure of which is incorporated herein by reference.

TECHNICAL FIELD

The present disclosure relates to a voltage sensing circuit and a battery pack monitoring system which sense a voltage difference between two input nodes.

BACKGROUND

When an A-D converter that has a high accuracy and is of a $\Delta\Sigma$ type is used to sense a battery voltage that is a voltage of a battery, it is necessary that an oversampling is executed in the A-D converter of a $\Delta\Sigma$ type. Then, a charge and discharge of a capacitor is repeated at a short cycle, and a leakage current that is a current leaked from the battery that is a sensing target is generated. In a system sensing the battery voltage, a low-pass filter including a capacitor and a resistance having a relatively high resistance value is arranged in an input region. Thus, a decrease of a voltage generated due to the leakage current flowing through the resistance of the low-pass filter leads to an error in a sensing result, and the decrease cannot be ignored with respect to a sensing value of the voltage.

According to US2012-0274360, a compensation circuit that generates a compensation current flowing in a direction opposite to a direction in which the leakage current flows is provided, and then the leakage current is cancelled. Thus, the error of the sensing result generated due to the decrease of the voltage generated by the resistance of the low-pass filter is reduced.

SUMMARY

However, according to US2012-0274360, it is possible that a cancelling voltage generating a compensation charge becomes greater than a maximum value of a voltage of the sensing target. In this case, it is necessary that a capacitor having a large capacity or a rail-to-rail amplifier is used to reduce the cancelling voltage. Then, an increase of a circuit area or an increase of a consumption current may be generated.

It is an object of the present disclosure to provide a voltage sensing circuit and a battery pack monitoring system which can suppress an increase of a circuit area and an increase of a consumption current and can improve a sensing accuracy of a voltage.

A voltage sensing circuit sensing a voltage difference between two input nodes includes a difference voltage sensing circuit and a leakage cancelling circuit. The difference voltage sensing circuit senses the voltage difference by sampling voltages of the two input nodes. The leakage cancelling circuit generates a compensation charge that is used to compensate a charge leaked from the two input nodes due to an operation of the difference voltage sensing circuit, by using a cancelling voltage.

The difference voltage sensing circuit has a differential configuration, where two sensing capacitors that are a pair, a first sensing switch that connects and disconnects a wiring between one of the two sensing capacitors and one of the two input nodes, a second sensing switch that connects and disconnects a wiring between the other one of the two sensing capacitors and the other one of the two input nodes, and a third sensing switch that connects and disconnects a wiring between the two sensing capacitors are arranged, and a first group including the first sensing switch and the second sensing switch and a second group including the third sensing switch are complementarily turned on and turned off.

According to the above configuration, the two sensing capacitors are connected with the input nodes only in a time interval where the first sensing switch and the second switch are turned on, and are disconnected from the input nodes in a time interval where the third sensing switch is turned on. In contrast, according to the above conventional configuration, two sensing capacitors are always connected with the input nodes. Thus, when conditions of the voltage difference of the sensing target and the capacity of the sensing capacitor are the same, comparing with the above conventional configuration, a leaked charge that is a charge leaked from the input nodes is smaller. Thus, the leakage cancelling circuit in the present disclosure generates the compensation charge smaller than the compensation charge generated in the above conventional configuration. Then, the cancelling voltage generating the compensation charge can be reduced.

The leakage cancelling circuit has a differential configuration, where two compensation capacitors that are a pair, a first compensation switch that connects and disconnects a wiring between one of the two compensation capacitors and one of the two input nodes, a second compensation switch that connects and disconnects a wiring between the other one of the two compensation capacitors and the other one of the two input nodes, and a third compensation switch that connects and disconnects a wiring between the two compensation capacitors are arranged, and a third group including the first compensation switch and the second compensation switch and a fourth group including the third compensation switch are complementarily turned on and turned off.

According to the leakage cancelling circuit, when the sensing capacitors and the compensation capacitors have same capacities, the compensation charge that is in a level same as the leaked charge can be generated by using the cancelling voltage that is in a level same as the voltage of the sensing target. According to the present disclosure, since the cancelling voltage generating the compensation charge can be reduced, influences generated due to the leakage current from the input nodes can be cancelled without using a capacitor with a large capacity or a rail-to-rail amplifier. Thus, an increase of a circuit area and an increase of a consumption current can be suppressed and a sensing accuracy of a voltage can be improved.

BRIEF DESCRIPTION OF THE DRAWINGS

The above and other objects, features and advantages of the present disclosure will become more apparent from the following detailed description made with reference to the accompanying drawings. In the drawings:

FIG. 7 is a diagram showing a relationship between the ratio of the capacity of the sensing capacitor to the capacity of the compensation capacitor and the counterbalancing voltage;

FIG. 9 is a diagram showing a relationship between the ratio of the capacity of the sensing capacitor to the capacity of the compensation capacitor and the counterbalancing voltage;

DESCRIPTION OF EMBODIMENTS

Figure 1:
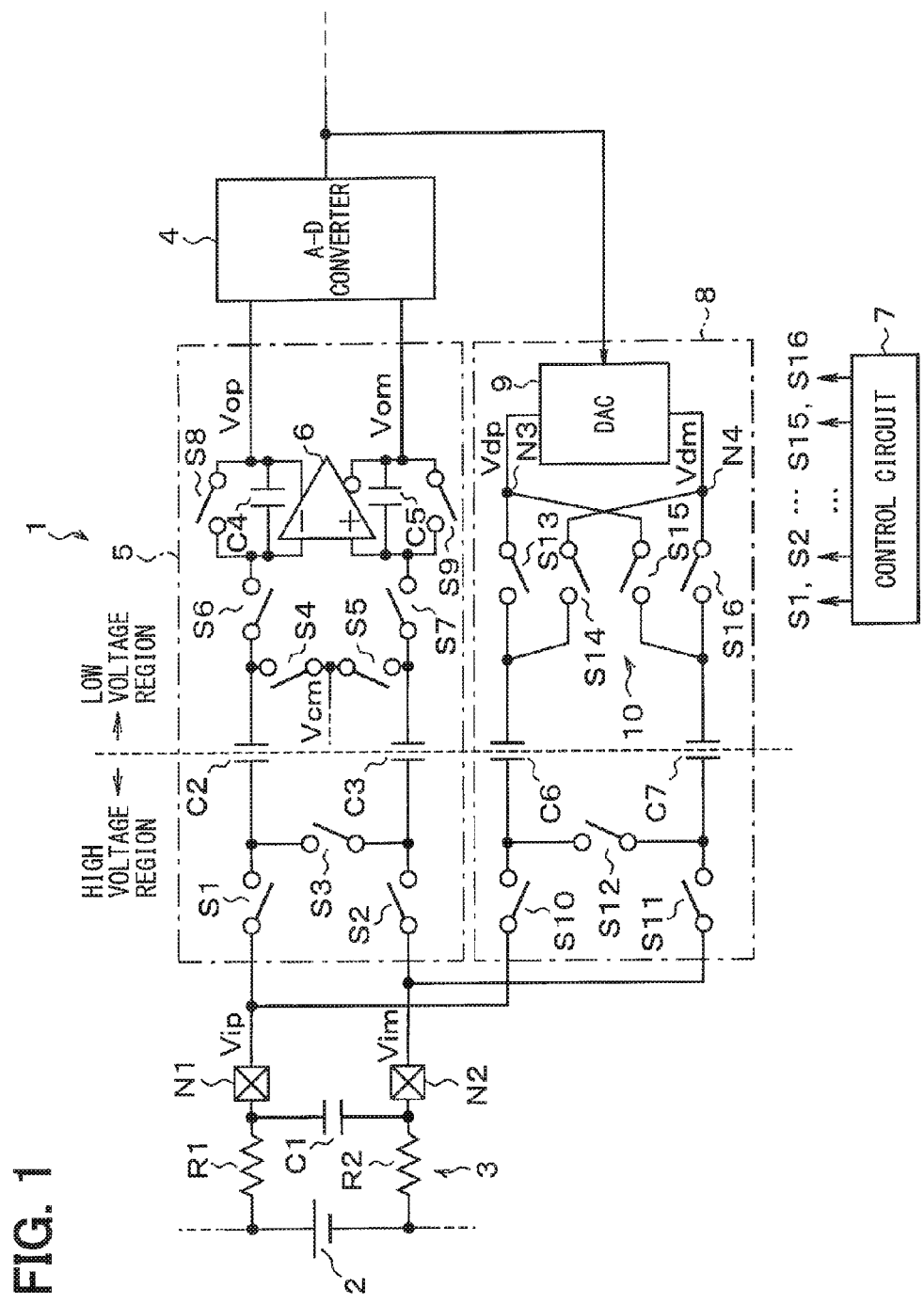
FIG. 1 is a schematic diagram showing a voltage sensing circuit according to a first embodiment of the present disclosure.

Embodiments of the present disclosure will be described hereafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

Hereafter, embodiments of the present invention will be described with reference to drawings. The substantially same parts or components as those in the embodiments are indicated with the same reference numerals and the same descriptions may be omitted.

First Embodiment

Referring to FIGS. 1 to 9, a first embodiment of the present disclosure will be described.

As shown in FIG. 1, a voltage sensing circuit 1 senses a voltage difference ΔVi that is a difference between a first input voltage Vip of a first input node N1 and a second input voltage Vim of a second input node N2. The first input node N1 is connected with a high voltage terminal of a battery cell 2 through a first resistance R1, and the second input node N2 is connected with a low voltage terminal of the battery cell 2 through a second resistance R2.

A first capacitor C1 is interposed between the first input node N1 and the second input node N2 and is connected with the first input node N1 and the second input node N2. The first capacitor C1, the first resistance R1, and the second resistance R2 constitutes an RC filter 3 that removes a noise. Circuits constituting the voltage sensing circuit 1 and an A-D converter 4 are equivalent to an IC. The A-D converter 4 may be of a ΔΣ type which accurately senses the voltages of the battery cell 2.

The battery cell 2 is connected with another cell(s) that is (are) not shown in series connection, to constitute a battery pack. Thus, a common mode voltage is superimposed at the battery cell 2. When the battery cell is arranged in the battery pack closer to the high voltage end, the common mode voltage becomes higher. According to the present embodiment, the common mode voltage superimposed at the battery cell 2 is from 100V to 1000V.

The voltage sensing circuit 1 includes a difference voltage sensing circuit that is a sample hold circuit having a differential configuration, and senses the voltage difference ΔVi by sampling the first input voltage Vip of the first input node N1 and the second input voltage Vim of the second input node N2. The difference voltage sensing circuit 5 includes an OP amplifier 6, a second capacitor C2, a third capacitor C3, a fourth capacitor C4, a fifth capacitor C5, a first switch S1, a second switch S2, a third switch S3, a fourth switch S4, a fifth switch S5, a sixth switch S6, a seventh switch S7, an eighth switch S8, and a ninth switch S9. The difference voltage sensing circuit 5 executes a level shift to decrease the common mode voltage that is high to a reference voltage Vcm that is low.

The common mode voltage of the OP amplifier 6 is set to equal to the reference voltage Vcm that is a reference of a voltage sensing. The reference voltage Vcm is an intermediate voltage of a power voltage VDD. The power voltage VDD is a power for each of circuits included in the voltage sensing circuit 1. According to the present embodiment, the power voltage VDD may be +5V, and the intermediate voltage may be +2.5V. The OP amplifier 6 outputs a first differential voltage Vop from a non-inverted output terminal and outputs a second differential voltage Vom from an inverted output terminal. The first differential voltage Vop and the second differential voltage Vom are equivalent to sensing voltages. The first differential voltage Vop and the second differential voltage Vom are converted into digital data by the A-D converter 4 that is of a differential input type. The digital data indicates a sensing value of the voltage difference ΔVi, and can be obtained by a superior control unit that is not shown.

In the differential configuration, the second capacitor C2 and the third capacitor C3 are arranged as a pair of sensing capacitors which is charged and discharged by the first input voltage Vip and the second input voltage Vim. The second capacitor C2 and the third capacitor C3 have capacities the same as each other. According to the present disclosure, when two or more components have capacities the same as each other, the components can achieve the same effects. In addition, when the components have capacities which are not completely identical and when the components can achieve the same effects, it can be stated that "the components have capacities the same as each other". Further, the second capacitor C2 and the third capacitor C3 have integrated circuits in a symmetric layout style in a design stage of the integrated circuits so as to match with each other as a pair. In this case, the second capacitor C2 and the third capacitor C3 are in a pair state where the second capacitor C2 and the third capacitor C3 have integrated circuits in a symmetric layout style. According to the present disclosure, when two capacitors are in the pair state, capacities of the two capacitors are equal to each other. Thus, sensing errors generated due to variations occurred in a manufacturing processing of the integrated circuits (IC) are reduced.

The first switch S1 is interposed between the first input node N1 and a first end of the second capacitor C2 and is connected with the first input node N1 and the first end of the second capacitor C2. The second switch S2 is interposed between the second input node N2 and a first end of the third capacitor C3 and is connected with the second input node N2 and the first end of the third capacitor C3. The first switch S1 is a first sensing switch that connects and disconnects a wiring between the second capacitor C2 and the first input node N1. The second switch S2 is a second sensing switch that connects and disconnects a wiring between the third capacitor C3 and the second input node N2. The third switch S3 is interposed between the second capacitor C2 and the third capacitor C3 and is connected with the second capacitor C2 and the third capacitor C3. The third switch S3 is a third sensing switch that connects and disconnects a wiring between the second capacitor C2 and the third capacitor C3. According to the present disclosure, three switches which are arranged the same as the first switch S1, the second switch S2, and the third switch S3 are in a 3SW configuration. In the 3SW configuration, the three switches are arranged to be connected with two nodes and two capacitors.

A second end of the second capacitor C2 is connected with a reference voltage terminal through the fourth switch S4, and the reference voltage Vcm can be applied to the second end of the second capacitor C2. A second end of the third capacitor C3 is connected with the reference voltage terminal through the fifth switch S5, and the reference voltage Vcm can be applied to the second end of the third capacitor C3. The second end of the second capacitor C2 is connected with an inverted input terminal of the OP amplifier 6 through the sixth switch S6. The second end of the third capacitor C3 is connected with a non-inverted input terminal of the OP amplifier 6 through the seventh switch S7. The eighth switch S8 and the fourth capacitor C4 are arranged between the inverted input terminal and the non-inverted output terminal in parallel connection. The ninth switch S9 and the fifth capacitor C5 are arranged between the non-inverted input terminal and the inverted output terminal in parallel connection.

The switches S1 to S9 are MOS transistors, and are controlled to be turned on and turned off by a control circuit 7. The first switch S1, the second switch S2, the fourth switch S4, the fifth switch S5, the eighth switch S8, and the ninth switch S9 are grouped as an A-switch group. The third switch S3, the sixth switch S6, and the seventh switch S7 are grouped as a B-switch group. When one of the A-switch group and the B-switch group is turned on, the other one of the A-switch group and the B-switch group is turned off. In other words, the A-switch group and the B-switch group are complementally turned on and turned off. According to the present disclosure, when two groups of switches are complementally turned on and turned off, all of the two groups of switches may be turned off for a time interval that is a dead time. In other words, when two groups of switches are complementally turned on and turned off, at least one of the two groups of switches is turned off. Further, when a switch group such as the A-switch group is turned on, all of the switches in the switch group are turned on. In the above configuration, since the common mode voltage superimposed at the battery cell 2 is applied to the second capacitor C2, the third capacitor C3, and circuit elements arranged between the capacitors C2, C3 and the battery pack, elements having high voltage resistances are used in the second capacitor C2, the third capacitor C3, and circuit elements arranged between the capacitors C2, C3 and the battery pack. Further, circuit elements in the difference voltage sensing circuit 5 except the second capacitor C2, the third capacitor C3, and circuit elements arranged between the capacitors C2, C3 and the battery pack use elements having low voltage resistances. The fourth capacitor C4 and the fifth capacitor C5 may use elements having high voltage resistances, so as to match with each other as a pair similar to the second capacitor C2 and the third capacitor C3. In other words, the fourth capacitor C4 and the fifth capacitor C5 are in a pair state.

Figure 2:
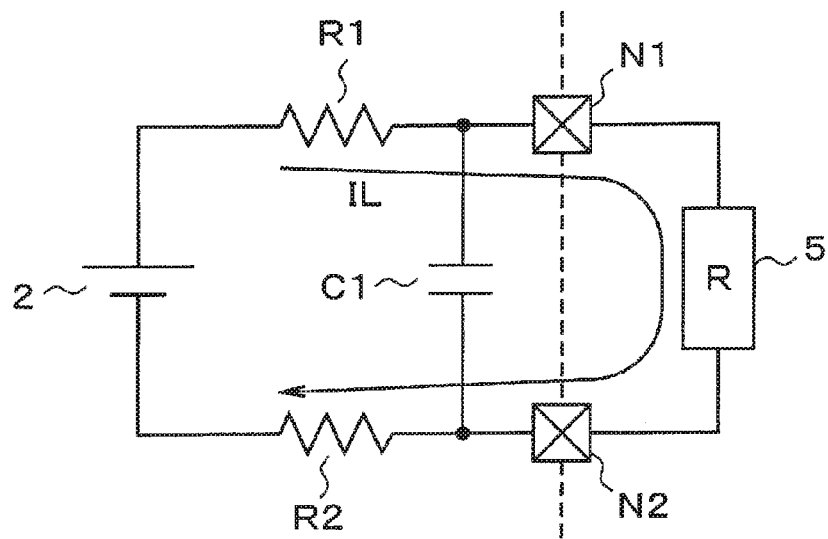
FIG. 2 is a diagram showing a battery cell, a filter, and a difference voltage sensing circuit.

A leaked charge that is an electric charge leaked from the first input node N1 and the second input node N2 is generated due to an operation of the difference voltage sensing circuit 5. In other words, a leakage current IL that is a current leaked from the battery cell 2 is generated due to the operation of the difference voltage sensing circuit 5. In the difference voltage sensing circuit 5, the charge and discharge of the capacitors C2, C3 are repeated at a predetermined cycle. As shown in FIG. 2, a virtual resistance R is equivalent to the difference voltage sensing circuit 5, and the leakage current IL is generated. Since the leakage current IL flows through the first resistance R1 and the second resistance R2 in the RC filter 3, a voltage applied to the virtual resistance R is decreased. Thus, an error of the voltage sensing of the voltage difference ΔVi is generated.

The voltage sensing circuit 1 includes a leakage cancelling circuit 8 that reduces a sensing error generated due to the leakage current IL.

Figure 3:
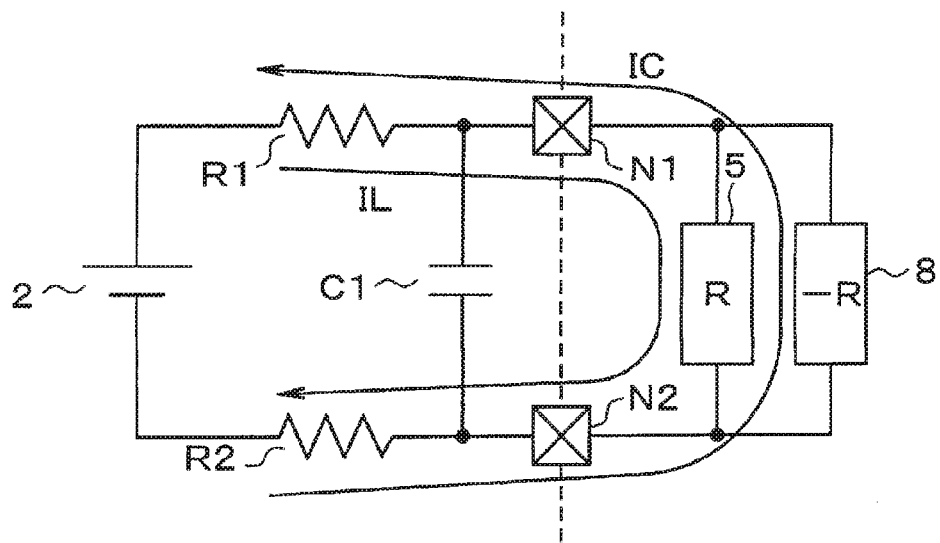
FIG. 3 is a diagram showing the battery cell, the filter, the difference voltage sensing circuit, and a leakage cancelling circuit.

As shown in FIG. 3, the leakage cancelling circuit 8 is interposed between the first input node N1 and the second input node N2 and is connected with the first input node N1 and the second input node N2. The leakage cancelling circuit 8 functions as a negative resistance "−R". In other words, the negative resistance "−R" is equivalent to the leakage cancelling circuit 8. Thus, a cancelling current IC flows through the first resistance R1 and the second resistance R2 in a direction opposite to a direction of the leakage current IL. Then, the leakage current IL is cancelled.

The leakage cancelling circuit 8 and the difference voltage sensing circuit are arranged between the first input node N1 and the second input node N2 in parallel connection. The leakage cancelling circuit 8 generates a compensation charge to compensate the leaked charge. The compensation charge is used to compensate the charge leaked from the battery cell 2. In other words, the leakage cancelling circuit 8 generates the cancelling current IC to cancel the leakage current IL that is the current leaked from the input nodes N1, N2.

The leakage cancelling circuit 8 having a differential configuration includes a DAC 9, the sixth capacitor C6, the seventh capacitor C7, a tenth switch S10, an eleventh switch S11, a twelfth switch S12, a thirteenth switch S13, a fourteenth switch S14, a fifteenth switch S15, and a sixteenth switch S16. The DAC 9 that is a voltage generating circuit outputs a third differential voltage Vdp through a first output node N3 and a fourth differential voltage Vdm through a second output node N4. The first output node N3 and the second output node N4 are cancelling nodes. Thus, the first output node N3 is a first cancelling node N3, and the second output node N4 is a second cancelling node N4. A voltage difference between the third differential voltage Vdp and the fourth differential voltage Vdm is equivalent to a cancelling voltage ΔVd that is used to generate the compensation charge. The DAC 9 includes a D-A converter. The DAC 9 generates the third differential voltage Vdp and the fourth differential voltage Vdm in response to the first differential voltage Vop and the second differential voltage Vom, by using the digital data outputted from the A-D converter 4.

Thus, the DAC 9 generates the cancelling voltage ΔVd according to a sensing value of the voltage difference ΔVi. That is, the DAC 9 generates the cancelling voltage ΔVd in response to the sensing voltages outputted from the difference voltage sensing circuit 5.

In the differential configuration, the sixth capacitor C6 and the seventh capacitor C7 are arranged as a pair of compensation capacitors which is charged and discharged by the third differential voltage Vdp and the fourth differential voltage Vdm. The sixth capacitor C6 and the seventh capacitor C7 have capacities the same as each other. Further, the sixth capacitor C6 and the seventh capacitor C7 have integrated circuits in a symmetric layout style in a design stage of the integrated circuits so as to match with each other as a pair. In this case, the sixth capacitor C6 and the seventh capacitor C7 are in a pair state where the sixth capacitor C6 and the seventh capacitor C7 have integrated circuits in a symmetric layout style. Thus, the sensing errors generated due to the variations occurred in a manufacturing processing of the integrated circuits (IC) are reduced.

The tenth switch S10 is interposed between the first input node N1 and a first end of the sixth capacitor C6 and is connected with the first input node N1 and the first end of the sixth capacitor C6. The eleventh switch S11 is interposed between the second input node N2 and a first end of the seventh capacitor C7 and is connected with the second input node N2 and the first end of the seventh capacitor C7. The tenth switch S10 is a first compensation switch that connects and disconnects a wiring between the sixth capacitor C6 and the first input node N1. The eleventh switch S11 is a second compensation switch that connects and disconnects a wiring between the seventh capacitor C7 and the second input node N2. The twelfth switch S12 is interposed between the sixth capacitor C6 and the seventh capacitor C7 and is connected with the sixth capacitor C6 and the seventh capacitor C7. The twelfth switch S12 is a third compensation switch that connects and disconnects a wiring between the sixth capacitor C6 and the seventh capacitor C7.

A second end of the sixth capacitor C6 is connected with the first output node N3 through the thirteenth switch S13 and is connected with the second output node N4 through the fourteenth switch S14. A second end of the seventh capacitor C7 is connected with the first output node N3 through the fifteenth switch S15 and is connected with the second output node N4 through the sixteenth switch S16. The switches S13 to S16 constitutes a switch circuit 10 that charges and discharges the capacitors C6 and C7 by using the cancelling voltage ΔVd.

According to the present disclosure, four switches which are arranged the same as the thirteenth switch S13, the fourteenth switch S14, the fifteenth switch S15, and the sixteenth switch S16 are in a 2SW configuration. In the 2SW configuration, the four switches are arranged to be connected with two nodes and two capacitors.

The switches S10 to S16 are MOS transistors, and are controlled to be turned on and turned off by the control circuit 7. The tenth switch S10, the eleventh switch S11, the thirteenth switch S13, and the sixteenth switch S16 are grouped as a C-switch group. The twelfth switch S12, the fourteenth switch S14, and the fifteenth switch S15 are grouped as a D-switch group. When one of the C-switch group and the D-switch group is turned on, the other one of the C-switch group and the D-switch group is turned off. In other words, the C-switch group and the D-switch group are complementarily turned on and turned off. In the above configuration, since the common mode voltage superimposed at the battery cell 2 is applied to the sixth capacitor C6, the fourth capacitor C7, and circuit elements arranged between the capacitors C6, C7 and the battery pack, elements having high voltage resistances are used in the sixth capacitor C6, the seventh capacitor C7, and circuit elements arranged between the capacitors C6, C7 and the battery pack. Further, circuit elements in the leakage cancelling circuit 8 except the sixth capacitor C6, the seventh capacitor C7, and circuit elements arranged between the capacitors C6, C7 and the battery pack use elements having low voltage resistances.

The control circuit 7 controls the operation of the difference voltage sensing circuit 5 and an operation of the leakage cancelling circuit 8. The control circuit 7 controls to turn on and turn off the switches S1 to S16 so as to control the difference voltage sensing circuit 5 and the leakage cancelling circuit 8 to operate in phases opposite to each other. Specifically, the control circuit 7 controls the switches S1 to S16 such that the A-switch group and the D-switch group are turned on and turned off at one timing, and the B-switch group and the C-switch group are turned on and turned off at another timing.

Next, a circuit constant properly generating the cancelling current IC will be described. In addition, the circuit constant will be described based on the first input node N1. The charge and the discharge are reversed when the circuit constant is described based on the second input node N2. The difference voltage sensing circuit 5 always generates a charging charge at the first input node N1 and always generates a discharging charge at the second input node N2. The leakage cancelling circuit 8 generates a discharging charge at the first input node N1 and always generates a charging charge at the second input node N2.

The difference voltage sensing circuit 5 charges the second capacitor C2 for one time by a charging quantity Qsh that is a quantity of the charging charge of the difference voltage sensing circuit 5. The leakage cancelling circuit 8 discharges the sixth capacitor C6 for one time by a discharging quantity Qlc that is a quantity of the discharging charge of the leakage cancelling circuit 8. The charging quantity Qsh and the discharging quantity Qlc are computed based on following formulas (1) and (2). A capacity of the second capacitor C2 is indicated by Csh, and a capacity of the sixth capacitor C6 is indicated by Clc.

$$Qsh = Csh \times (Vip - Vcm - (((Vip + Vim)/2) - Vcm)) \quad (1)$$

$$Qlc = Clc \times (Vip - Vdp - (((Vip + Vim)/2) - Vdm)) \quad (2)$$

When an absolute value of the charging quantity Qsh is equal to an absolute value of the discharging quantity Qlc, that is, when a following formula (3) is met, the leaked charge is completely compensated. In this case, the leakage current IL is completely cancelled, and a following formula (4) is obtained. In the formula (4), (Vip−Vim) is indicated by ΔVi, and (Vdp−Vdm) is indicated by ΔVd.

$$Qsh + Qlc = 0 \quad (3)$$

$$\Delta Vd = ((Csh + Clc)/(2 \times Clc)) \times \Delta Vi \quad (4)$$

In the formula (4), the voltage difference ΔVi and the capacity Csh of the second capacitor C2 are set in response to a specification of a sensing target. According to the present embodiment, the sensing target is the battery cell 2.

According to the present embodiment, to meet the formula (4), the cancelling voltage ΔVd and the capacity Clc of the sixth capacitor C6 are set such that the leakage current IL is completely cancelled.

Next, effects of the above configurations will be described.

In addition, effects will be described based on operations of the difference voltage sensing circuit 5 and the leakage cancelling circuit 8 at the first input node N1. Since the difference voltage sensing circuit 5 and the leakage cancelling circuit 8 have differential configurations, effects obtained based on the operations at the second input node N2 are the same as effects obtained based on the operations at the first input node N1.

Figures 4, 5:
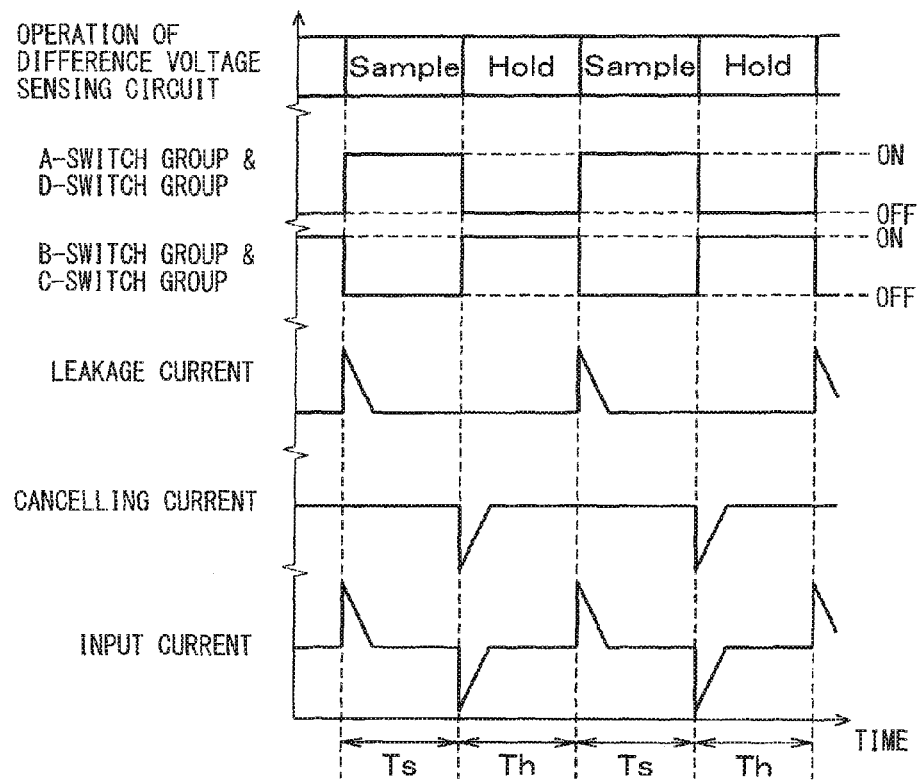
FIG. 4 is a time chart showing operations of components and signal waveforms.
FIG. 5 is a diagram showing a relationship between a ratio of a capacity of a sensing capacitor to a capacity of a compensation capacitor and a counterbalancing voltage.

As shown in FIG. 4, a time interval where the A-switch group and the D-switch group are turned on is a sampling time interval Ts where the difference voltage sensing circuit 5 executes a sampling operation. In the sampling time interval Ts, since the capacitor C2 is charged by the first input voltage Vip, a charging current flows from the first input node N1 toward the difference voltage sensing circuit 5. In other words, the leakage current IL is generated at the first input node N1 in the sampling time interval Ts. In the leakage cancelling circuit 8, since the sixth capacitor C6 is disconnected from the first input node N1, the fourth differential voltage Vdm is applied to the sixth capacitor C6, and the sixth capacitor C6 is charged by the fourth differential voltage Vdm. Thus, the cancelling current IC that is a current flowing from the leakage cancelling circuit 8 toward the first input node N1 cannot flow. In other words, the cancelling current IC does not exist.

A time interval where the B-switch group and the C-switch group are turned on is a holding time interval Th where the difference voltage sensing circuit 5 executes a holding operation. In the holding time interval Th, the sixth capacitor C6 charged in the sampling time interval Ts is discharged when the first end of the sixth capacitor C6 is connected with the first input node N1 and when the second end of the sixth capacitor C6 is connected with the first output node N3.

In this case, a discharging current of the sixth capacitor C6 flows from the leakage cancelling circuit 8 toward the first input node N1. In the holding time interval Th, the cancelling current IC cancelling the leakage current IL is generated.

As shown in FIG. 4, since the above operations are repeated, an input current flowing through the first input node N1 has a waveform that varies in a pulsation. Specifically, the input current is shifted to be greater in response to the leakage current IL and is shifted to be smaller in response to the cancelling current IC. Since the RC filter 3 is connected with the first input node N1, a variation of the input current is suppressed. In this case, since the leakage current IL is equal to the cancelling current IC, an average of the input current becomes zero. In other words, the leakage current IL is completely cancelled by the cancelling current.

According to the present embodiment, following effects can be obtained.

In the leakage cancelling circuit 8, the cancelling voltage ΔVd and the capacity Clc of the capacitor C6 or C7 are set to meet the formula (4), so as to completely cancel the leakage current.

FIG. 5 shows a relationship between the cancelling voltage ΔVd and a ratio of the capacity Csh of the capacitor C2 or C3 to the capacity Clc of the capacitor C6 or C7. According to the present embodiment, when the capacity of the capacitor C6 or C7 in the leakage cancelling circuit 8 is the same level of or greater than the capacity of the capacitor C2 or C3 in the difference voltage sensing circuit 5, the cancelling voltage ΔVd can be set to be equal to or less than the voltage difference ΔVi of the sensing target.

When the battery cell 2 is a lithium ion battery, it is necessary that the voltage sensing circuit 1 senses the voltage difference ΔVi in the vicinity of 5V.

Since the voltage sensing circuit 1 includes integrated circuits (IC), the cancelling voltage ΔVd is generated in the integrated circuits (IC). Thus, since a voltage resistance is typically generated at a CMOS element voltage resistance, the cancelling voltage ΔVd is 5V at most.

In this case, according to the present embodiment, influences generated due to the leakage current from the input nodes N1 and N2 can be cancelled without using a capacitor with a large capacity or a rail-to-rail amplifier.

Hereafter, comparison examples will be described, and the substantially same parts and the components as the present embodiment are indicated with the same reference numeral and the same description will be omitted.

Figure 6:
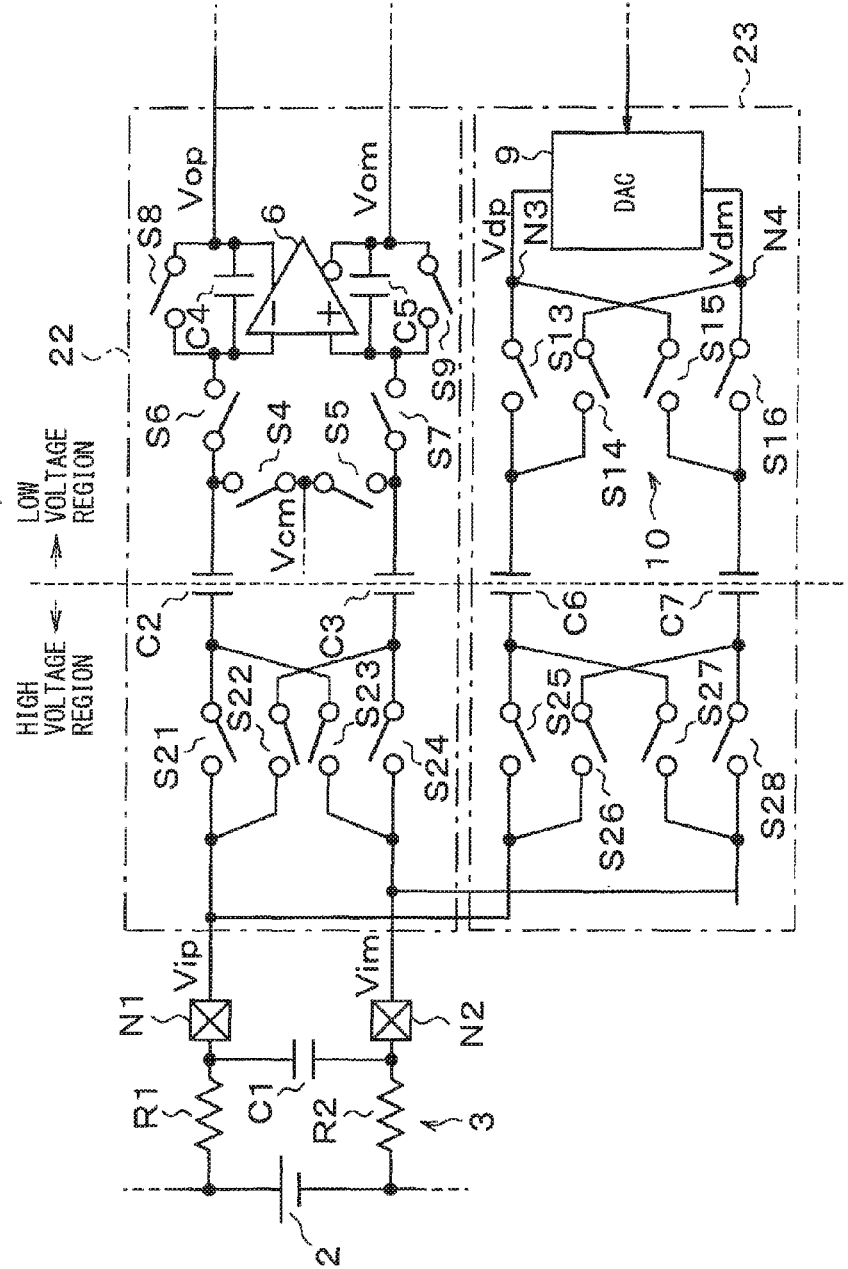
FIG. 6 is a schematic diagram showing the voltage sensing circuit according to a first comparison example.

As shown in FIG. 6, a voltage sensing circuit 21 according to a first comparison example has a configuration in a high voltage region which is different from a configuration of the voltage sensing circuit 1 in a high voltage region in the present embodiment. Specifically, in high voltage regions of a difference voltage sensing circuit 22 and a leakage cancelling circuit 23, switches S21 to S24 arranged between the battery pack and the capacitors C2, C3 and switches S25 to S28 arranged between the battery pack and the capacitors C6, C7 have 2SW configurations. The switches S21, S24, S4, S5, S8, and S9 are grouped as an A-switch group, and the switches S22, S23, S6, and S7 are grouped as a B-switch group. The A-switch group and the B-switch group are complementally turned on and turned off. The switches S25, S28, S13, and S16 are grouped as a C-switch group, and the switches S26, S27, S14, and S15 are grouped as a D-switch group. The C-switch group and the D-switch group are complementally turned on and turned off. The A-switch group and the D-switch group are turned on and turned off at one timing, and the B-switch group and the C-switch group are turned on and turned off at another timing.

A circuit constant property generating the cancelling current in the first comparison example will be described. In addition, the circuit constant will be described based on the first input node N1. The difference voltage sensing circuit 22 charges the second capacitor C2 for one time by a charging quantity Qsh that is a quantity of the charging charge of the difference voltage sensing circuit 22. The leakage cancelling circuit 23 discharges the sixth capacitor C6 for one time by a discharging quantity Qlc that is a quantity of the discharging charge of the leakage cancelling circuit 23. The charging quantity Qsh and the discharging quantity Qlc are computed based on following formulas (5) and (6).

$$Qsh = Csh \times ((Vip - Vcm) - (Vim - Vcm)) \quad (5)$$

$$Qlc = Clc \times ((Vip - Vdp) - (Vim - Vdm)) \quad (6)$$

When the formula (3) is met that the leakage current is completely cancelled, a following formula (7) can be obtained as a conditional expression that indicates the leakage current is completely cancelled.

$$\Delta Vd = ((Csh + Clc)/Clc) \times \Delta Vi \quad (7)$$

In the leakage cancelling circuit 23 according to the first comparison example, the cancelling voltage ΔVd and the capacity Clc of the sixth capacitor C6 are set to meet the formula (7), so as to completely cancel the leakage current.

FIG. 7 shows a relationship between the cancelling voltage ΔVd and a ratio of the capacity Csh of the capacitor C2 or C3 to the capacity Clc of the capacitor C6 or C7. According to the first comparison example, the cancelling voltage ΔVd is greater than the voltage difference ΔVi of the sensing target, without respect to the capacity Clc of the capacitor C6 or C7.

Figure 8:
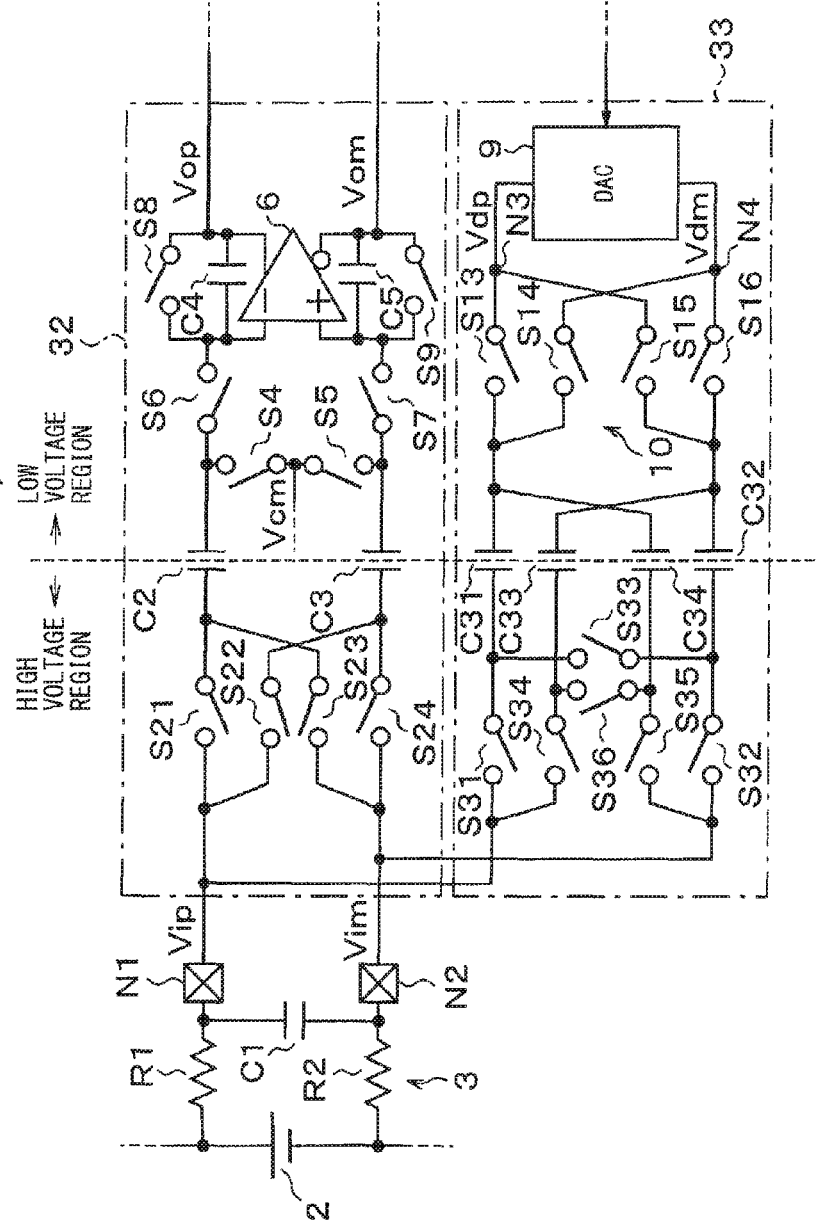
FIG. 8 is a schematic diagram showing the voltage sensing circuit according to a second comparison example.

As shown in FIG. 8, a voltage sensing circuit 31 according to a second comparison example has a configuration in a high voltage region which is different from the configuration of the voltage sensing circuit 1 in the high voltage region in the present embodiment. Specifically, a difference voltage sensing circuit 32 has a configuration the same as that of the difference voltage sensing circuit 22 in the first comparison example. Further, in a leakage cancelling circuit 33, two pairs of compensation capacitors are arranged.

Switches S31 to S33 arranged between the battery pack and one of the two pairs of the compensation capacitors that is a pair of capacitors C31, C32 are in the 3SW configuration. Switches S34 to S36 arranged between the battery pack and the other of the two pairs of the compensation capacitors that is a pair of capacitors C33, C34 are in the 3SW configuration.

The switches S21, S24, S4, S5, S8, and S9 are grouped as an A-switch group, and the switches S22, S23, S6, and S7 are grouped as a B-switch group. The A-switch group and the B-switch group are complementally turned on and turned off. The switches S31, S32, S36, S13, and S16 are grouped as a C-switch group, and the switches S33, S34, S35, S14, and S15 are grouped as a D-switch group. The C-switch group and the D-switch group are complementally turned on and turned off. The A-switch group and the D-switch group are turned on and turned off at one timing, and the B-switch group and the C-switch group are turned on and turned off at another timing.

A circuit constant properly generating the cancelling current in the second comparison example will be described. In addition, the circuit constant will be described based on the first input node N1. The difference voltage sensing circuit 32 charges the second capacitor C2 for one time by a charging quantity Qsh that is a quantity of the charging charge of the difference voltage sensing circuit 32. The charging quantity Qsh is computed based on the formula (5) as the same as that in the first comparison example. The leakage cancelling circuit 33 discharges the capacitor C31, C33 for one time by a discharging quantity Qlc that is a quantity of the discharging charge of the leakage cancelling circuit 33. The discharging quantity Qlc is computed based on a following formula (8)

$$Qlc = Clc \times ((Vip-Vdp)-(((Vip+Vim)/2)-Vdm)) \quad (8)$$

When the formula (3) is met that the leakage current is completely cancelled, a following formula (9) can be obtained as a conditional expression that indicates the leakage current is completely cancelled.

$$\Delta Vd = ((Csh + (Clc/2))/Clc) \times \Delta Vi \quad (9)$$

In the leakage cancelling circuit 33 of the second comparison example, the cancelling voltage ΔVd and the capacity Clc of the capacitor C31 or C33 may be set to meet the formula (9), so as to completely cancel the leakage current IL.

In this case, a relationship between the cancelling voltage ΔVd and a capacity ratio that is a ratio of the capacity Csh of the capacitor C2 or C3 to the capacity Clc of the capacitor C31, C32 C33, or C34 is shown in FIG. 9.

In other words, according to the second comparison example, when the capacity Clc of the capacitor C31, C32, C33, or C34 becomes a value two times or more of the capacity Csh of the capacitor C2 or C3, the cancelling voltage ΔVd can be less than or equal to the voltage difference ΔVi of the sensing target.

As the above descriptions, in the difference voltage sensing circuit 22 of the first comparison example and the difference voltage sensing circuit 32 of the second comparison example, the 2SW configuration is provided in the high voltage region, and capacitors C2 and C3 are always connected with the input nodes N1 and N2. In the difference voltage sensing circuit 5 of the present embodiment, the 3SW configuration is provided in the high voltage region, and the capacitors C2 and C3 are connected with the input nodes N1 and N2 only in the sampling time interval Ts, and are disconnected from the input nodes N1 and N2 in the holding time interval Th. Thus, when conditions of the voltage difference ΔVi of the sensing target and the capacity Csh of the capacitor C2 or C3 are the same, comparing with the first comparison example and the second comparison example, the leaked charge that is leaked from the input nodes N1 and N2 is smaller.

Thus, the leakage cancelling circuit 8 in the present embodiment generates the compensation charge smaller than the compensation charge generated by the leakage cancelling circuits 23 and 33 in the first comparison example and the second comparison example. Then, the cancelling voltage ΔVd generating the compensation charge can be reduced.

In the first comparison example, the cancelling voltage ΔVd is greater than the voltage difference ΔVi of the sensing target, without respect to the capacity Clc of the capacitor C6 or C7 in the leakage cancelling circuit 23. Thus, in the first comparison example, when the maximum value of the voltage difference ΔVi is a value that is the same level of an element voltage resistance of an IC inner circuit, it is impossible that the cancelling current that can completely cancel the leakage current is generated.

When the DAC 9 is constituted by an element voltage resistance that is high, a requested respond speed cannot be obtained. Then, it is possible that the leakage current is not cancelled.

In the second comparison example, when the capacity of the capacitor C31. C32, C33, or C34 becomes a value two times or more of the capacity of the capacitor C2 or C3, the cancelling voltage ΔVd can be less than or equal to the voltage difference ΔVi of the sensing target. Thus, in the second comparison example, when the maximum value of the voltage difference ΔVi is a value that is the same level of an element voltage resistance of an IC inner circuit, it is necessary that a capacitor having a large capacity is used as the compensation capacitor.

In this case, two pairs of compensation capacitors are necessary. In other words, four compensation capacitors are necessary.

Since the capacitors C31 to C34 are connected with the input nodes N1 and N2 through the switches S31, S32, S34, and S35, it is necessary that the capacitors C31 to C34 have high voltage resistances. In this case, the capacitors C31 to C34 are generally arranged at a wiring layer when being provided in the integrated circuits (IC). Thus, when the capacities of the capacitors or a total number of the capacitors are increased, a circuit area is remarkably increased. Then, in the second comparison example, the capacity of the compensation capacitor is set to be small to suppress an increase of the circuit area. In this case, it is necessary to use a rail-to-rail amplifier having a wide output range. Thus, the circuit area is increased, and a consumption current is increased.

According to the present embodiment, when the capacitors C6 and C7 of the leakage cancelling circuit 8 have capacities that are the same level of or greater than the capacities of the capacitors C2 and C3 of the difference voltage sensing circuit 5, the cancelling voltage ΔVd can be set to be equal to or less than the voltage difference ΔVi. Thus, when the maximum value of the voltage difference ΔVi becomes a value that is the same level of an element voltage resistance of an IC inner circuit, influences generated due to the leakage current from the input nodes N1 and N2 can be cancelled without using a capacitor with a large capacity or a rail-to-rail amplifier.

In other words, according to the present embodiment, an increase of the circuit area and an increase of the consumption current can be suppressed, and a sensing accuracy of the voltage can be improved.

The DAC 9 includes the D-A converter. The DAC 9 generates the third differential voltage Vdp and the fourth differential voltage Vdm in response to the first differential voltage Vop and the second differential voltage Vom, by using the digital data outputted from the A-D converter 4. Thus, the cancelling current can be properly generated in response to a ratio of the capacity of the capacitor C2 or C3 to the capacity of the capacitor C6 or C7, so as to change the cancelling voltage ΔVd.

When the D-A converter is used, a previous A-D conversion value that is a digital data is used to generate the cancelling voltage ΔVd. In this case, the previous A-D conversion value is an A-D conversion value that is obtained last time or an A-D conversion value that is obtained before last time. Thus, when the previous A-D conversion value separated from a present A-D conversion value that is an A-D conversion value that is presently obtained, it is possible that the leakage current is not properly cancelled and a leakage cancelling error is generated.

A difference between the previous A-D conversion value and the present A-D conversion value cannot be increased by influences of an outer filter or influences of a filter of a ΔΣ type. When a battery voltage that is a voltage of a battery is sensed after an engine starts, the voltage of the battery that is the sensing target is not sharply changed. Thus, according to the present embodiment, when the D-A converter is used to generate the cancelling voltage ΔVd, the leakage cancelling error is not generated and the above effects can be obtained.

When a ratio of the capacity of the capacitor C2 or C3 to the capacity of the capacitor C6 or C7 is 1:1, the DAC 9 can be cancelled. In other words, when the cancelling voltage ΔVd is equal to the voltage difference ΔVi, the leakage current can be completely cancelled. In this case, since the DAC 9 is cancelled, the differential voltages Vop, Vom outputted from the difference voltage sensing circuit 5 are transmitted to the output nodes N3, N4, respectively. Further, the leakage cancelling circuit 8 uses the sensing voltages outputted from the difference voltage sensing circuit 5 as the cancelling voltage ΔVd.

As the above description, since the DAC 9 is cancelled, the circuit area and the consumption current can be suppressed.

Second Embodiment

Figure 10:
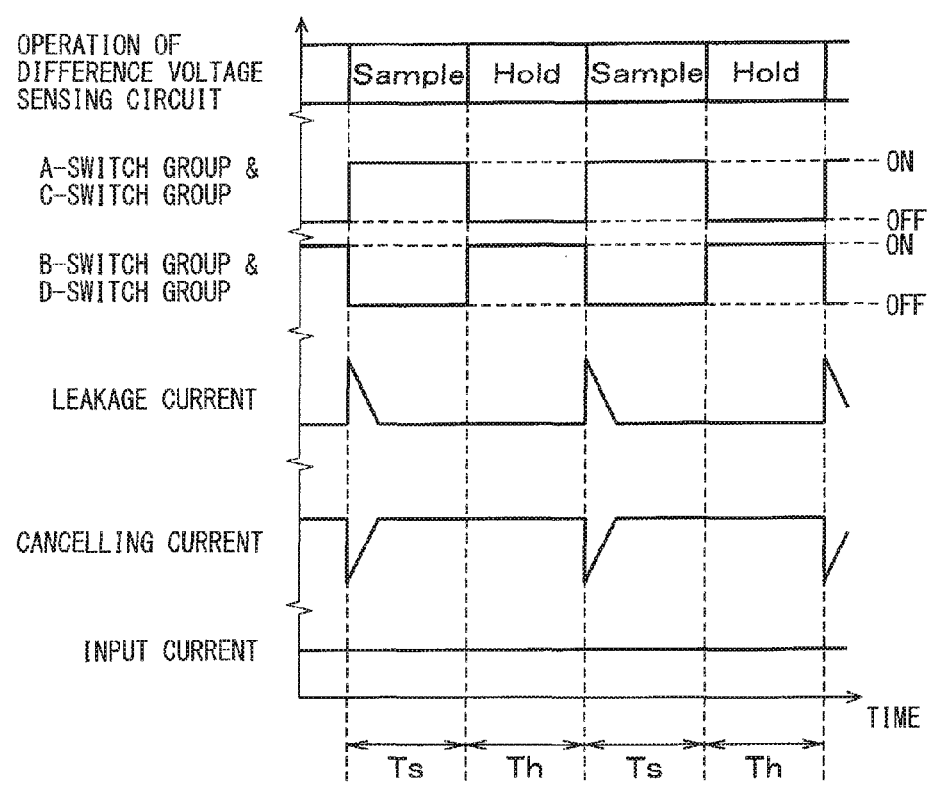
FIG. 10 is a time chart showing operations of components and signal waveforms in a first control, according to a second embodiment of the present disclosure.
Figure 11:
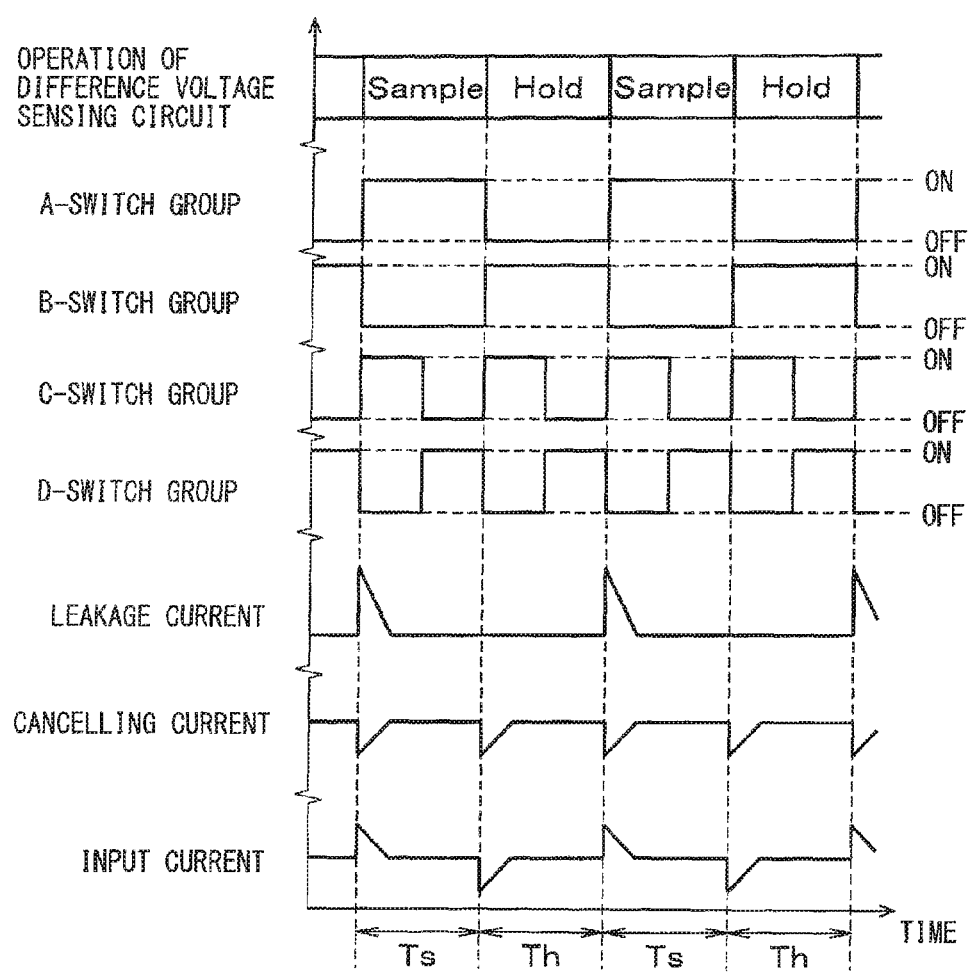
FIG. 11 is a time chart showing operations of components and signal waveforms in a second control, according to the second embodiment.

Referring to FIGS. 10 and 11, a second embodiment of the present disclosure will be described.

According to the first embodiment, the control circuit 7 executes a control where the difference voltage sensing circuit 5 and the leakage cancelling circuit 8 operate in phases opposite to each other. However, it is not limited. According to the present embodiment, two controls including a first control and a second control which are different from the control in the first embodiment will be described.

In the first control, the control circuit 7 controls the switches S1 to S16 such that the difference voltage sensing circuit 5 and the leakage cancelling circuit 8 operate in phases same as each other. In other words, the control circuit 7 controls the switches S1 to S16 where the A-switch group and the C-switch group are simultaneously turned on and turned off and the B-switch group and the D-switch group are simultaneously turned on and turned off. In this case, when one of the A-switch group and the B-switch group is turned on, the other one of the A-switch group and the B-switch group is also turned on.

As shown in FIG. 10, in the sampling time interval Ts where the A-switch group and the C-switch group are simultaneously turned on, the leakage current is generated same as that in a case where the A-switch group and the C-switch group are complementally turned on and turned off.

However, since the sixth capacitor C6 charged in the holding time interval Th is discharged, the cancelling current flows through the leakage cancelling circuit 8.

In the holding time interval Th where the B-switch group and the D-switch group are simultaneously turned on, both the leakage current and the cancelling current cannot flow or do not exist.

Since the above operations are repeated, the input current flowing through the first input node N1 has a waveform that is hardly changed as shown in FIG. 10. The input current shown in FIG. 10 indicates an ideal state. Actually, when a magnitude of the leakage current and a magnitude of the cancelling current are slightly different from each other, a difference between the magnitude of the leakage current and the magnitude of the cancelling current affects the input current. That is, the input current changes by the difference between the magnitude of the leakage current and the magnitude of the cancelling current affects the input current.

According to the first control, the input current has a waveform that is hardly changed in the ideal state. In this case, it is possible that the circuit area of the control circuit 7 controlling the switches included in the difference voltage sensing circuit 5 and the leakage cancelling circuit 8 is increased. When an increase of the circuit area is allowed, the first control can be used. In this case, a change of the input current is generally zero.

In the second control, the control circuit 7 controls on-off operations of the switches S10 to S16 of the leakage cancelling circuit 8 in plural cycles while controlling on-off operations of the switches S1 to S9 of the difference voltage sensing circuit 5 in one cycle. In this case, the plural cycles may be two or more cycles. Further, the capacity Clc of the capacitor C6 or C7 is half of that in the first embodiment.

According to the second control, the operation of the difference voltage sensing circuit 5 is same as that in the first embodiment. In other words, the A-switch group is turned on in the sampling time interval Ts, and the B-switch group is turned on in the holding time interval Th. The control circuit 7 controls the switches S10 to S16 of the leakage cancelling circuit 8 such that the C-switch group is turned on in one half of the sampling time interval Ts and the holding time interval Th and the D-switch group is turned on in the other half of the sampling time interval Ts and the holding time interval Th. In other words, the C-switch group is turned on in one half of a time interval including the sampling time interval Ts and the holding time interval Th, and the D-switch group is turned on in the other half of the time interval.

As shown in FIG. 11, in the sampling time interval Ts where the A-switch group is turned on, the leakage current is generated same as that in a case where the A-switch group and the C-switch group are complementally turned on and turned off. However, since the sixth capacitor C6 charged in a later half of the holding time interval Th just before a sampling time interval Ts is discharged in an earlier half of the sampling time interval Ts, the cancelling current flows through the leakage cancelling circuit 8.

In this case, the magnitude of the cancelling current is half of the magnitude of the leakage current.

In the holding time interval Th where the B-switch group is turned on, the leakage current is not generated same as that in a case where the B-switch group and the D-switch group are complementally turned on and turned off.

However, since the sixth capacitor C6 charged in a later half of the sampling time interval Ts just before a holding time interval Th is discharged in an earlier half of the holding time interval Th, the cancelling current flows through the leakage cancelling circuit 8.

In this case, the magnitude of the cancelling current is half of the magnitude of the leakage current.

Since the above operations are repeated, the input current flowing through the first input node N1 has a waveform that varies in a pulsation as shown in FIG. 11. Specifically, the input current is shifted to be greater in an earlier half of the sampling time interval Ts and is shifted to be smaller in a later half of the holding time interval Th. A magnitude of the pulsation is half of that in the first embodiment.

In the second control, it is possible that the circuit area is more increased than that in the first control and a switching noise is increased. When the increase of the circuit area and an increase of the switching noise are allowed, the second control can be used. A variation of the input current can be suppressed, and the capacity of the capacitor C6 or C7 can be decreased.

Third Embodiment

Figure 12:
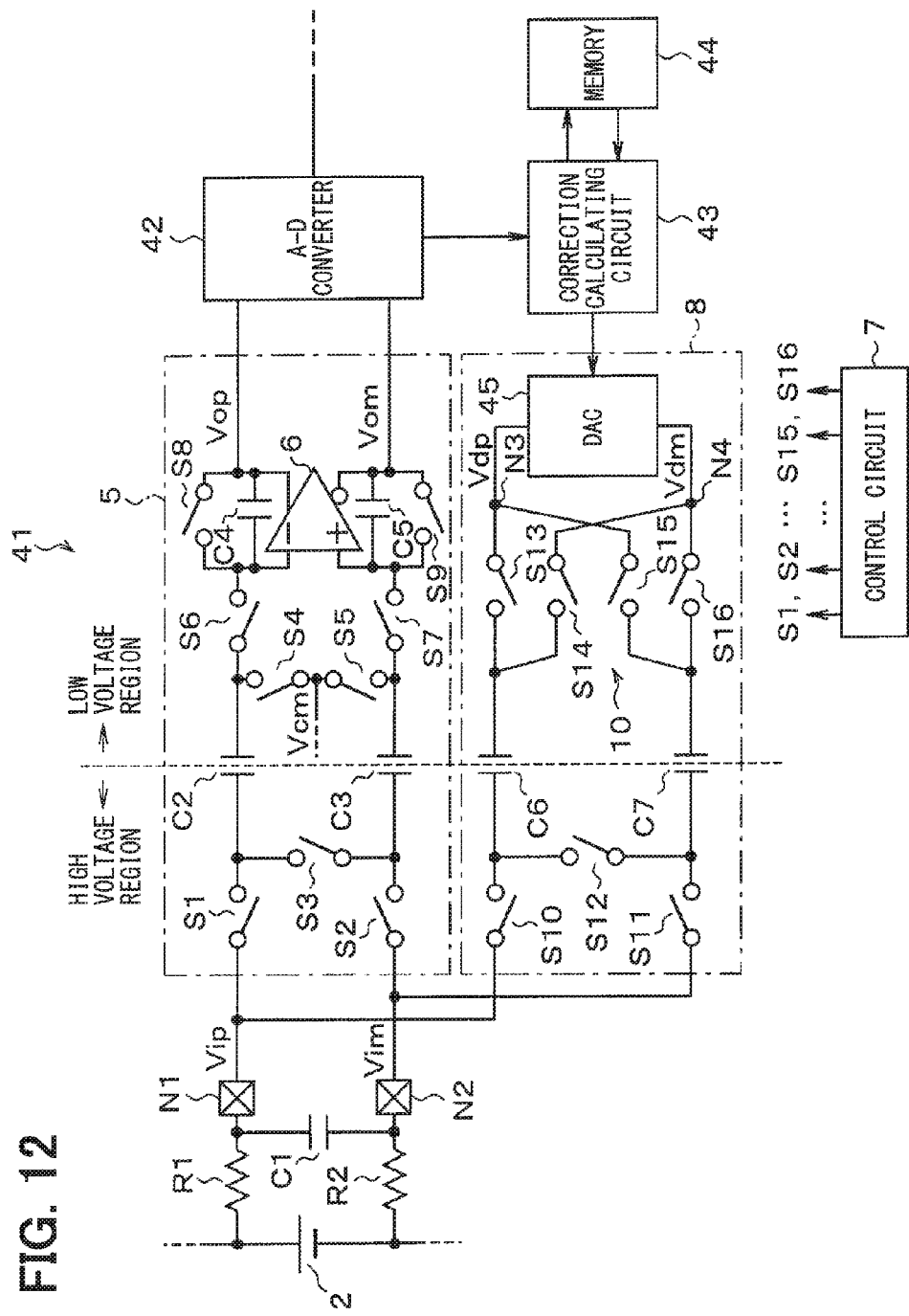
FIG. 12 is a schematic diagram showing the voltage sensing circuit according to a third embodiment of the present disclosure.

Referring to FIG. 12, a third embodiment of the present disclosure will be described.

When the ratio (=Csh:Clc) of the capacity of the capacitor C2 or C3 to the capacity of the capacitor C6 or C7 differs from a capacity ratio that is requested due to a manufacturing variation or a parasitic capacitance, the leakage current cannot be cancelled, that is, the leakage cancelling error is generated. According to the present embodiment, the leakage cancelling error is mainly generated according to a capacity difference between the ratio of the capacity of the capacitor C2 or C3 to the capacity of the capacitor C6 or C7 and the capacity ratio.

When the ratio is equal to 1:1 and $\Delta Vd$ is equal to $\Delta Vi$ multiplied by 1.0 and when the capacity difference exists, an actual ratio is computed by a following formula (10). The capacity difference is indicated by $\alpha$, and the capacities of the capacitors C2, C3, C6, and C7 are indicated by C.

$$Csh{:}Clc=(1+\alpha)\times C{:}C \tag{10}$$

In this case, the charging quantity Qsh by which the capacitor C2 or C3 is charged for one time, and the discharging quantity Qlc by which the capacitor C6 or C7 is charged for one time are computed by following formulas (11) and (12).

$$Qsh=Csh\times\Delta Vi/2=(1+\alpha)\times C\times\Delta Vi/2 \tag{11}$$

$$Qlc=Clc\times\Delta Vi/2-Clc\times\Delta Vd=C\times\Delta Vi/2-C\times\Delta Vd=-C\times\Delta Vi/2 \tag{12}$$

When the capacity difference exists, the leakage current cannot be completely cancelled. In this case, a sum of the charging quantity Qsh and the discharging quantity Qlc is not zero as a following formula (11)

$$Qsh+Qlc=\alpha\times C\times\Delta Vi/2\ne 0 \tag{13}$$

It is considered that the leakage cancelling error and the capacity difference $\alpha$ are previously obtained and then the cancelling voltage $\Delta Vd$ is corrected by a correction coefficient obtained by using the capacity difference $\alpha$ so as to prevent a deterioration of the sensing accuracy generated due to the leakage cancelling error.

Specifically, when the cancelling voltage $\Delta Vd$ is obtained by a following formula (14), the discharging quantity Qlc becomes a value opposite to the charging quantity Qsh as a following formula (15). Thus, the leakage current can be completely cancelled.

$$\Delta Vd=(1+\alpha/2)\times\Delta Vi \tag{14}$$

$$Qlc=C\times\Delta Vi/2-C\times\Delta Vd=-(1+\alpha)\times C\times\Delta Vi/2=-Qsh \tag{15}$$

According to the present embodiment, a voltage sensing circuit 41 executing a correction will be described. As shown in FIG. 12, in the voltage sensing circuit 41, an A-D converter 42 converts the sensing voltage transmitted from the difference voltage sensing circuit 5 into a digital data. In this case, the digital data is not limited to be obtained by a superior control unit. The digital date can be obtained from a correction calculating circuit 43 in the voltage sensing circuit 41. A memory 44 in the voltage sensing circuit 41 stores a correction coefficient $\beta$ obtained by using the capacity difference $\alpha$. The correction coefficient $\beta$ is obtained by a following formula (16)

$$\beta=1+\alpha/2 \tag{16}$$

The correction coefficient $\beta$ can be obtained by a difference between a known voltage value and a sensing voltage that is a voltage between the first input node N1 and the second input node N2 which are connected with a known power in an examining processing. In this case, the known power has the known voltage value.

The correction calculating circuit 43 executes a correction calculation to calculate a voltage value of the cancelling voltage $\Delta Vd$ that corrects the leakage cancelling error, based on the correction coefficient 3 loaded from the memory 44 and the digital data indicating the sensing value of the voltage difference $\Delta Vi$ transmitted from the A-D converter 42.

The correction calculating circuit 43 outputs the digital data indicating the voltage value of the cancelling voltage $\Delta Vd$ obtained by the correction calculation to a DAC 45. According to the present embodiment, the DAC 45 includes a D-A converter.

The DAC 45 transmits the digital data transmitted from the correction calculating circuit 43 to the D-A converter, and then outputs the cancelling voltage $\Delta Vd$ having the voltage value calculated by the correction calculating circuit 43.

According to the present embodiment, when the ratio (=Csh:Clc) of the capacity of the capacitor C2 or C3 to the capacity of the capacitor C6 or C7 differs from the capacity ratio that is requested due to the manufacturing variation or the parasitic capacitance, the voltage sensing circuit 41 corrects the cancelling voltage $\Delta Vd$ to cancel effects of the capacity difference. Thus, the leakage current can be properly cancelled, and the sensing accuracy of the voltage can be suitably maintained.

Fourth Embodiment

Figure 13:
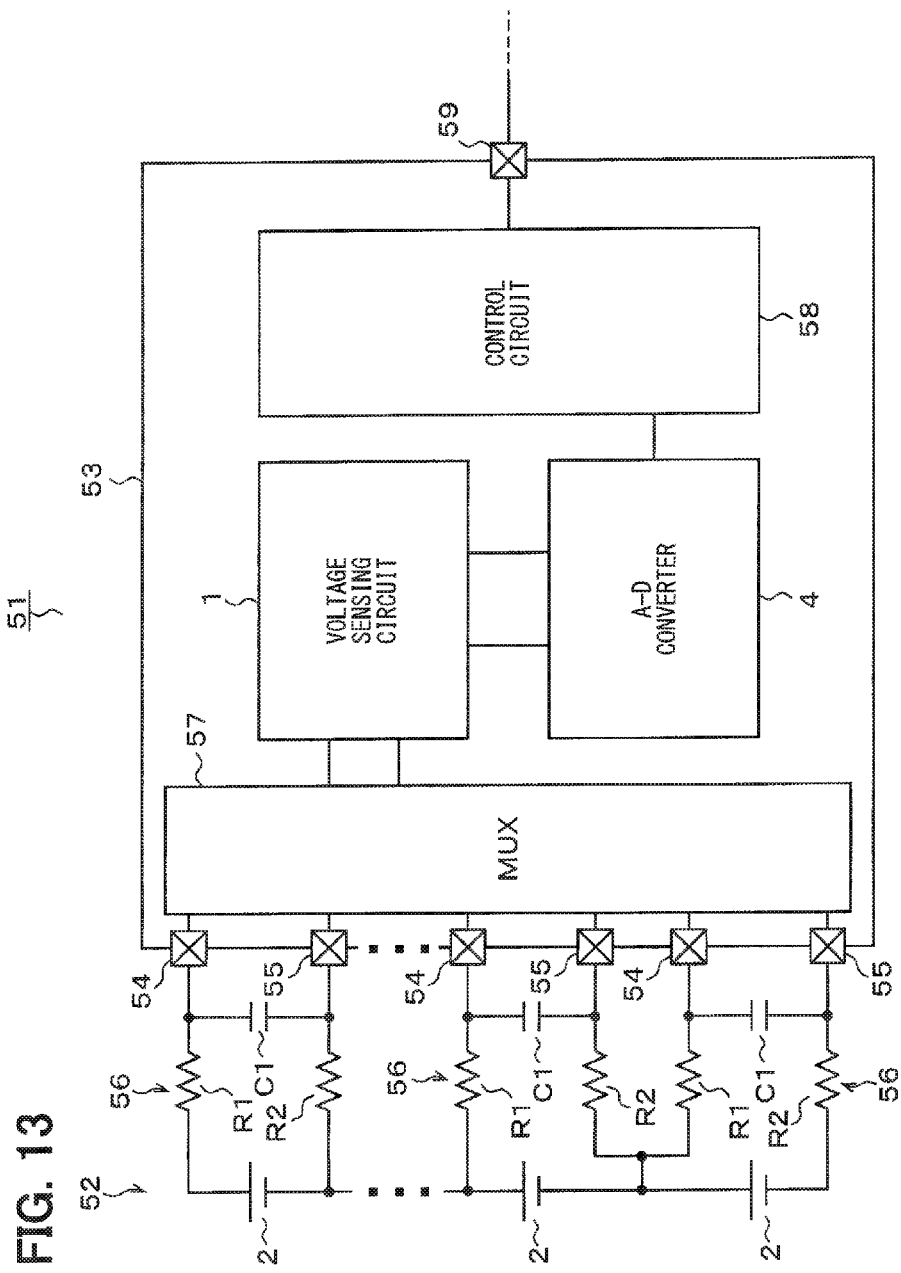
FIG. 13 is a schematic diagram showing a battery pack monitoring system according to a fourth embodiment of the present disclosure.

Referring to FIG. 13, a fourth embodiment of the present disclosure will be described.

As shown in FIG. 13, a battery pack monitoring system 51 monitors a voltage of each of the battery cells 2 that constituting a battery pack 52. The battery pack 52 includes plural battery cells 2 which are secondary batteries or fuel batteries. In the battery pack 52, the battery cells 2 are connected with each other in series connection.

A battery monitoring IC 53 includes first connection terminals 54 which correspond to high voltage terminals of the battery cells 2, and second connection terminals 55 which correspond to low voltage terminals of the battery cells 2. The first connection terminals 54 and the second connection terminals 55 correspond to the first input nodes N1 and the second input nodes N2 shown in FIG. 1, respectively. Filters 56 removing noises are connected between the battery cells 2 and the connection terminals 54, 55. The filters 56 correspond to the RC filter 3 shown in FIG. 1.

A multiplexer (MUX) 57 includes plural switch circuits. The multiplexer 57 selects one group among plural groups of the connection terminals 54, 55 and is connected with the voltage sensing circuit 1 through the group that is selected. The voltage sensing circuit 1 samples voltages of the connection terminals 54, 55 which are connected with the voltage sensing circuit 1 through the multiplexer 57, so as to sense voltage differences between terminals of the battery cells 2 which correspond to the connection terminals 54, 55. The battery monitoring IC 53 senses the voltage of the battery cells 2 at time divisions by the voltage sensing circuit 1 which senses one voltage at one time division. The voltage sensing circuit 1 outputs the sensing voltage indicating the voltage difference that is sensed to the A-D converter 4.

The A-D converter 4 converts the sensing voltage transmitted from the voltage sensing circuit 1 into a digital data that is a voltage data. The A-D converter 4 may be of a $\Delta\Sigma$ type which accurately senses the voltages of the battery cells 2. Thus, in the voltage sensing circuit 1, an oversampling where an input signal is sampled at a frequency sufficiently higher than a target sampling frequency is executed.

An equalization switch that is not shown and executes an equalization operation to equalize the voltages of the battery cells 2 is arranged between the connection terminals 54, 55 and the multiplexer 57.

A control circuit 58 controls operations of the multiplexer 57, the voltage sensing circuit 1, the A-D converter 4, and the equalization switch. The control circuit 58 receives the voltage data outputted from the A-D converter 4. The control circuit 58 includes a communication interface that is not shown and executes communications between the control circuit 58 and a superior control unit. The control circuit 58 sends the voltage data of the battery cells 2 to the superior control unit from an output terminal 59 through a communication network.

When a voltage sensing system where an input impedance becomes higher due to a RC filter arranged in an input region uses an oversampling, a sensing error generated due to a leakage current remarkably occurs. In this case, when the voltage sensing circuit 1 is used, the increase of the circuit area and the increase of the consumption current can be suppressed, a generation of the sensing error due to the leakage current can be suppressed, and the sensing accuracy of the voltage can be suitably maintained.

Other Embodiment

The present disclosure is not limited to the embodiments and the drawings mentioned above, and can be applied to various embodiments within the spirit and scope of claims of the present disclosure.

According to the above embodiments, the voltage sensing circuit uses to sense the voltage difference of the battery cell constituting the battery pack. However, the voltage sensing circuit can be used to sense a voltage difference of two input nodes which have a common mode voltage that is not zero.

When the sensing error of the voltage can be suppressed to a value less than or equal to a target value, the pair state of the capacitors C2 and C3 and the pair state of the capacitors C6 and C7 are unnecessary.

A configuration of the difference voltage sensing circuit 5 at the low voltage region and a configuration of the leakage cancelling circuit 8 at the low voltage region can be modified in a case where the difference voltage sensing circuit 5 and the leakage cancelling circuit 8 function same as that do in the above embodiments.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A voltage sensing circuit sensing a voltage difference between two input nodes, comprising:
    a difference voltage sensing circuit sensing the voltage difference by sampling voltages of the two input nodes; and
    a leakage cancelling circuit generating a compensation charge that is used to compensate a charge leaked from the two input nodes due to an operation of the difference voltage sensing circuit, by using a cancelling voltage, wherein
    the difference voltage sensing circuit has a differential configuration, where two sensing capacitors that are a pair, a first sensing switch that connects and disconnects a wiring between one of the two sensing capacitors and one of the two input nodes, a second sensing switch that connects and disconnects a wiring between the other one of the two sensing capacitors and the other one of the two input nodes, and a third sensing switch that connects and disconnects a wiring between the two sensing capacitors are arranged,
    a first group including the first sensing switch and the second sensing switch and a second group including the third sensing switch are complementarily turned on and turned off,
    the leakage cancelling circuit has a differential configuration, where two compensation capacitors that are a pair, a first compensation switch that connects and disconnects a wiring between one of the two compensation capacitors and one of the two input nodes, a second compensation switch that connects and disconnects a wiring between the other one of the two compensation capacitors and the other one of the two input nodes, and a third compensation switch that connects and disconnects a wiring between the two compensation capacitors are arranged, and
a third group including the first compensation switch and the second compensation switch and a fourth group including the third compensation switch are complementally turned on and turned off.

2. The voltage sensing circuit according to claim 1, wherein
when the cancelling voltage is expressed as ΔVd, a capacity of one of the sensing capacitors is expressed as Csh, a capacity of one of the compensation capacitors is expressed as Clc, and a voltage difference that is a difference between voltages of the two input nodes, the cancelling voltage ΔVd and the capacity Clc of one of the compensation capacitors are set based on a formula that ΔVd=((Csh+Clc)/(2×Clc))×ΔVi.

3. The voltage sensing circuit according to claim 1, wherein
the two sensing capacitors are in a pair state.

4. The voltage sensing circuit according to claim 1, wherein
the two sensing capacitors are in a pair state.

5. The voltage sensing circuit according to claim 1, wherein
the leakage cancelling circuit includes a switch circuit that charges and discharges the two compensation capacitors by using the cancelling voltage, and
the switch circuit includes two switches that are a first circuit switch and a second circuit switch which connect and disconnect a wiring between one of two cancelling nodes to which the cancelling voltage is applied and the two compensation capacitors, and two switches that are a third circuit switch and a fourth circuit switch which connect and disconnect a wiring between the other one of the tow cancelling nodes and the two compensation capacitors.

6. The voltage sensing circuit according to claim 1, wherein
the leakage cancelling circuit directly uses a sensing voltage outputted from the difference voltage sensing circuit as the cancelling voltage.

7. The voltage sensing circuit according to claim 1, wherein
the leakage cancelling circuit uses a voltage in response to a sensing voltage outputted from the difference voltage sensing circuit as the cancelling voltage.

8. The voltage sensing circuit according to claim 1, wherein
the leakage cancelling circuit executes a correction of a sensing voltage outputted from the difference voltage sensing circuit, and then uses a voltage that is corrected as the cancelling voltage.

9. The voltage sensing circuit according to claim 1, further comprising:
a control circuit controlling an operation of the difference voltage sensing circuit and an operation of the leakage cancelling circuit, wherein
the control circuit controls the first sensing switch, the second sensing switch, the third sensing switch, the first compensation switch, the second compensation switch, and the third compensation switch, so as to control the difference voltage sensing circuit and the leakage cancelling circuit to operate in phases opposite to each other.

10. The voltage sensing circuit according to claim 1, further comprising:
a control circuit controlling an operation of the difference voltage sensing circuit and an operation of the leakage cancelling circuit, wherein
the control circuit controls the first sensing switch, the second sensing switch, the third sensing switch, the first compensation switch, the second compensation switch, and the third compensation switch, so as to control the difference voltage sensing circuit and the leakage cancelling circuit to operate in phases same as each other.

11. The voltage sensing circuit according to claim 1, further comprising:
a control circuit controlling an operation of the difference voltage sensing circuit and an operation of the leakage cancelling circuit, wherein
the control circuit controls the first sensing switch, the second sensing switch, the third sensing switch, the first compensation switch, the second compensation switch, and the third compensation switch, so as to execute the operation of the leakage cancelling circuit in plural cycles while executing the operation of the difference voltage sensing circuit in one cycle.

12. A battery pack monitoring system monitoring a voltage of each of battery cells that constitute a battery pack, the battery pack monitoring system comprising:
the voltage sensing circuit according to claim 1;
a filter arranged at a position between voltage terminals of each of the battery cells and the two input nodes of the voltage sensing circuit, the voltage terminals including a high voltage terminal and a low voltage terminal; and
an A-D converter converting a sensing voltage outputted from the difference voltage sensing circuit into a digital data, wherein
the voltage sensing circuit senses the voltage difference by using an oversampling from a sensing target that is the battery cells.

* * * * *